(12) United States Patent
Sibigtroth et al.

(10) Patent No.: US 7,042,765 B2
(45) Date of Patent: May 9, 2006

(54) MEMORY BIT LINE SEGMENT ISOLATION

(75) Inventors: James M. Sibigtroth, Round Rock, TX (US); George L. Espinor, Austin, TX (US); Bruce L. Morton, Lakeway, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 13 days.

(21) Appl. No.: 10/912,824

(22) Filed: Aug. 6, 2004

(65) Prior Publication Data
US 2006/0028898 A1 Feb. 9, 2006

(51) Int. Cl.
*G11C 16/04* (2006.01)

(52) U.S. Cl. .......................... 365/185.13; 365/185.11; 365/189.04; 365/230.03

(58) Field of Classification Search .................... None
See application file for complete search history.

(56) References Cited

U.S. PATENT DOCUMENTS

| | | | | |
|---|---|---|---|---|
| 5,956,273 A | * | 9/1999 | Lin et al. ............... | 365/185.19 |
| 5,959,887 A | * | 9/1999 | Takashina et al. ..... | 365/185.13 |
| 5,978,250 A | * | 11/1999 | Chung et al. ............... | 365/145 |
| 6,396,728 B1 | * | 5/2002 | Abedifard et al. ............ | 365/63 |
| 6,421,272 B1 | * | 7/2002 | Noguchi ................. | 365/185.05 |
| 6,465,818 B1 | * | 10/2002 | Kato .......................... | 257/207 |
| 6,628,563 B1 | * | 9/2003 | Hsu et al. .............. | 365/230.03 |
| 6,678,191 B1 | * | 1/2004 | Lee et al. .............. | 365/185.17 |
| 6,684,345 B1 | | 1/2004 | Harari et al. | |
| 6,891,755 B1 | * | 5/2005 | Silvagni et al. ........ | 365/185.13 |

OTHER PUBLICATIONS

International Search Report and Written Opinion.

* cited by examiner

*Primary Examiner*—Son Mai
(74) *Attorney, Agent, or Firm*—Robert L. King; David G. Dolezal

(57) ABSTRACT

A single memory array (10) has an isolation circuit for isolating segments of a same bit line (Seg1 BL0, Seg2 BL0) from each other. The isolation circuit (16) permits memory cells located in one segment (12) of an array to be read while memory cells of another segment (14) of the array are being erased. In one example, the isolation circuit (16) electrically couples the segments during a read or program of memory cells located on the second segment (Seg2 BL0). Program information stored in the single memory array may always be accessed while a portion of the same array is erased. Dynamic variation of the size of the isolated bit line segment occurs when multiple isolation circuits are used to create more than two array segments.

24 Claims, 3 Drawing Sheets

MEMORY BIT LINE SEGMENT ISOLATION

FIELD OF THE INVENTION

This invention relates to memories, and more particularly to nonvolatile memories.

BACKGROUND OF THE INVENTION

Read, program and erase operations in a memory occur during different memory modes. As a result, when a memory is being erased or programmed, the memory is not otherwise accessible for read operations. When a memory stores both program and data information, the memory is unavailable for code execution. The unavailability of the memory will starve an associated processor from vital information. A known solution to this problem is to implement a memory system with multiple separate memory arrays. Therefore, when one memory array is being programmed or erased, the other memory array is independently available. However, a significant disadvantage to this type of memory system exists. The use of separate memory arrays results in significantly more size and circuitry for the memory system because additional memory decoders, drivers and control circuitry are required. Such additional circuitry also results in a more expensive memory system. For example, the cost of implementing a separate block of EEPROM or small-sector FLASH to guarantee access to program memory is prohibitive. The result of this limitation is reduced system performance. When the program memory is not available, no interrupt servicing may occur in a memory system. As a result, system latency occurs and is dependent on the erase time of the memory which is typically slow for nonvolatile memory.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION

Figure 1:
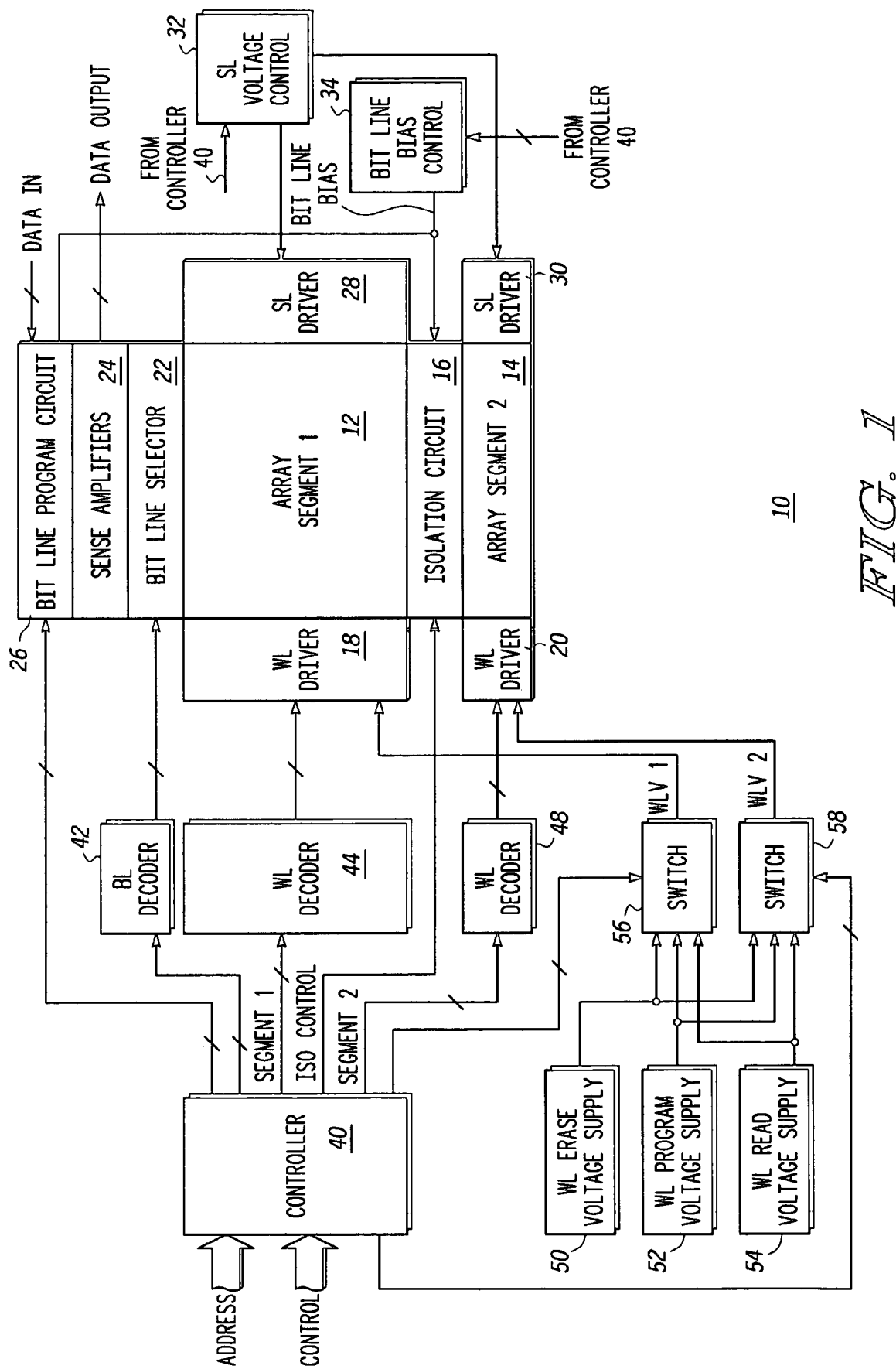
FIG. 1 is a block diagram of a memory system in accordance with the present invention.

FIG. 1 illustrates a memory system 10 that has a single memory array in which a first segment may be read while a second segment which shares bit lines with the first segment is being erased. Thus two separate nonvolatile memory arrays do not have to be implemented to ensure program access during an erase operation.

In the illustrated form, memory system 10 has a first array segment 12 and a second array segment 14 that are separated by an isolation circuit 16. The first array segment 12 and the second array segment 14 share the same bit line connection through the isolation circuit 16 and are controlled by respective control and driver circuitry. The first array segment 12 and second array segment 14 may be implemented as any nonvolatile memory, such as FLASH or EEPROM. Additionally, any of various known types of memory cell circuits may be used. A word line driver 18 is connected to each word line (not shown) of the first array segment 12. A word line driver 20 is connected to each word line (not shown) of the second array segment 14. A bit line selector 22 is connected to each bit line of the first array segment 12 and the second array segment 14. Sense amplifiers 24 are connected to the bit line selector 22. Any type of sense amplifier circuitry may be used to implement sense amplifiers 24. A bit line program circuit 26 is connected to the bit line within the first array segment that is chosen by the bit line selector 22. It should be understood that the bit line program circuit 26 is directly connected to the bit line selector 22 and is not isolated from the bit line selector 22 by sense amplifiers 24. The bit line program circuit 26 has a data input labeled "Data In" for receiving input data. A source line (SL) driver 28 is connected to the source lines (not shown) of the first array segment 12. A source line (SL) driver 30 is connected to the source lines (not shown) of the second array segment 14. A source line (SL) voltage control circuit 32 has a first output connected to the SL driver 28 and a second output connected to the SL driver 30. A controller 40 provides control for the memory system 10. The controller 40 has a first input for receiving a memory address and a second input for receiving control information. The controller 40 has a first output connected to the bit line program circuit 26. The controller 40 has a second output connected to a bit line (BL) decoder 42. An output of BL decoder 42 is connected to a control input of the bit line selector for controlling which bit line is selected. The controller 40 has a third output labeled 'Segment 1' connected to an input of a word line (WL) decoder 44. An output of word line decoder 44 is connected to a first control input of the word line driver 18. A fourth output of controller 40 provides an Isolation (ISO) Control signal that is connected to an input of the isolation circuit 16. A fifth output of controller 40 is labeled 'Segment 2' and is connected to an input of a word line decoder 48. An output of the word line decoder 48 is connected to an input of the word line driver 20. A sixth output of controller 40 is connected to a control input of a switch 56, and a seventh output of controller 40 is connected to a control input of switch 58. A word line erase voltage supply 50 has an output connected to both a first input of switch 56 and a first input of switch 58. A word line program voltage supply 52 has an output connected to both a second input of switch 56 and a second input of switch 58. A word line read voltage supply 54 has an output connected to both a third input of switch 56 and a third input of switch 58. An output of switch 56 is connected to a word line voltage (WLV) input of the word line driver 18. An output of switch 58 is connected to a word line voltage (WLV) input of the word line driver 20.

In operation, address and control signals are applied to put the memory system 10 in an erase mode of operation. In erase mode, one or more word line drivers will apply a high voltage to one or more word lines. The nature of the memory cell is such that erase is accomplished after this bias condition is maintained after an extended period of time. During that period of time ordinarily it is not possible to read data from the array that is being erased. Therefore, in a system where execution code is stored in the same array containing elements being erased, execution has to be suspended during the erase operation. Memory system 10 functions to permit one array segment, such as segment 2, to be erased while accessing the execution code in the other array segment, such as segment 1, in a read mode. Ordinarily, a programming operation would also inhibit access to the execution code. However, programming is a relatively fast operation and therefore the interruption in the availability of execution code is more tolerable. Memory system 10 is not designed to enable a read operation while programming. This compromise results in substantial cost savings relative to implementing two totally independent arrays that would enable independent operation in all modes.

Controller 40 receives a memory address that is partially decoded to select either segment 1 or segment 2. Therefore, either WL decoder 44 or WL decoder 48, or both, are selected. Also controller 40 provides bit line information to BL decoder 42 which decodes the bit line information and provides a decoded bit line select signal. In response, bit line selector 22 selects a bit line to connect to a respective one of the sense amplifiers 24. Controller 40 also receives control information that informs controller 40 what operating mode the memory system is in. For example, an instruction may exist to read from array segment 1 while erasing from array segment 2. In that case, the controller 40 would enable switch 56 to pass a word line voltage equal to the word line read supply level to word line driver 18. Controller 40 would enable switch 58 to pass a word line erase voltage to word line driver 20. It would also assert the ISO control signal such that isolation circuit 16 isolates the bit lines in array segment two from array segment one. The bit line bias control circuit 34 is enabled for programming operations. When reading or erasing the bit line bias voltage will be at approximately the supply voltage of $V_{DD}$. When programming, the bit line bias voltage may be at $V_{DD}$ or a higher voltage for programming operations. The SL voltage control circuit 32 provides the SL voltage to the two SL drivers 28 and 30. In program mode the SL voltage is a high voltage, such as ten volts. However, this voltage value is process and technology dependent. The SL voltage control circuit 32 may supply a lower voltage, such as $V_{DD}$, during read and erase operations. To avoid repetition, a description of the SL voltage generation and the bit line bias generation will not be repeated in the following examples.

In another example, an instruction may exist to read from either array segment 1 or array segment 2 without activating program or erase circuitry. In that case, switches 56 and 58 both output a word line read supply voltage and controller 40 activates one word line in array segment 1 or array segment 2. It also de-asserts the ISO control signal so that the isolation circuit 16 is in a conductive state such that array segment 1 and array segment 2 bit lines are connected. Irrespective of whether the active word line is in array segment 1 or 2, sense amplifiers 24 will be able to read the data on the selected word lines.

In yet another example, an instruction may exist to program bits on a word line in either array segment 1 or array segment 2. In this example, controller 40 causes switches 56 and 58 to select the word line (WL) program voltage supply and apply that voltage to word line drivers 18 and 20, respectively. Controller 40 also de-asserts the ISO control signal such that array segment 1 and array segment 2 bit lines are connected. Controller 40 enables bit line program circuit 26 to apply appropriate programming biases on one side of array segment 1 and that same bias condition passes through the isolation circuit to array segment 2. This allows programming of data into either array segment 1 or array segment 2.

In another example, an instruction may exist to erase bits contained only within array segment 1. In this situation, bits within array segment 2 may not be read while erasing segment 1. Controller 40 enables switch 56 to pass a word line voltage equal to the word line erase supply level to word line driver 18. While the array segment 2 can not be read, controller 40 enables switch 58 to pass a lower voltage in the form of the word line read voltage to word line driver 20. Therefore, no high voltage is preferably applied to word line driver 20 to improve the life operation of word line driver 20. The state of the ISO control signal is a 'don't care' state in this mode of operation and it will not matter to the output whether the ISO control signal is asserted.

In a further example, an instruction is received to simultaneously erase all word lines in both segments of memory system 10. Controller 40 causes switches 56 and 58 to both output a word line erase supply voltage and controller 40 activates all word lines in array segment 1 and array segment 2. Controller 40 may either assert or de-assert the ISO control signal which is in a 'don't care' state.

Therefore, from the examples provided herein it should be apparent that memory system 10 functions to permit the reading of a first segment of memory cells connected to a bit line while erasing a second segment of memory cells connected to the same bit line. Because the erase operation in a memory is typically long relative to the read operation or programming, this functionality permits continual access to program information while an erase occurs. In contrast, a program operation is relatively fast. While memory system 10 does not permit simultaneously read and program operations, it is not as important to system performance to isolate an array segment when in program mode. By isolating the portion of a single memory array that has program storage from that portion of the same memory array which is frequently erased, the memory system performance is enhanced.

Figure 2:
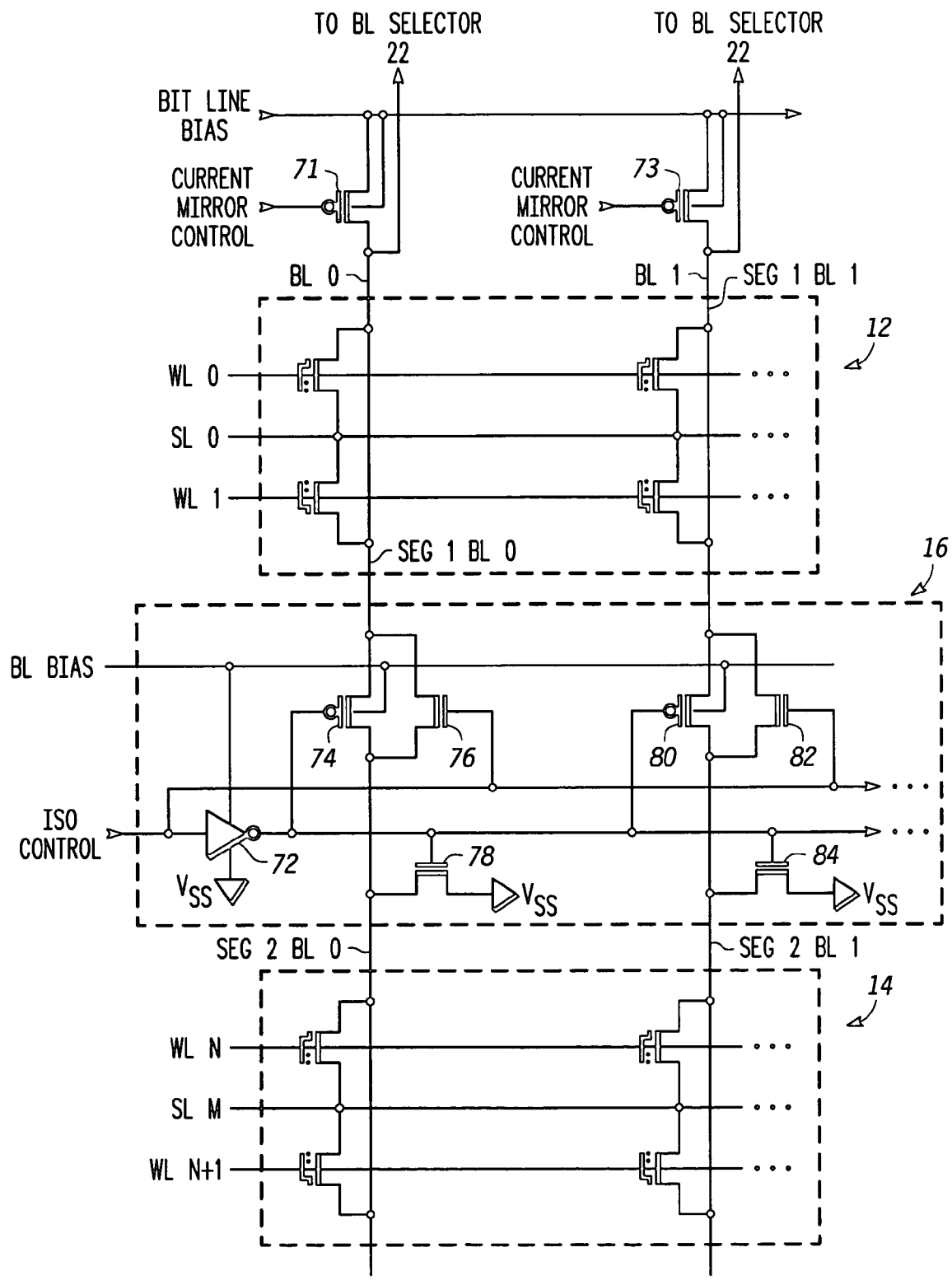
FIG. 2 is a schematic of a segmented array and isolation circuitry of the memory system of FIG. 1.

Illustrated in FIG. 2 is a schematic of one form of a memory 70 illustrating the two selectively isolated memory arrays of first array segment 12 and second array segment 14 of FIG. 1. For purposes of convenience, elements in FIG. 2 that are identical to those of FIG. 1 are similarly numbered. A P-channel transistor 71 has a source connected to a conductor for receiving a Bit Line Bias voltage. A gate of transistor 71 is connected to a current mirror control signal. A drain of transistor 71 is connected to a first bit line, labeled BL0. The bit line BL0 is connected to the bit line selector 22 of FIG. 1. The bit line BL0 is connected to specific memory cell transistors in the first array segment 12. In the illustrated form, the memory cell transistors are floating gate memory storage devices. Various known implementations of floating gate devices may be used to implement the memory cells. The bit line BL0 is divided by the isolation circuit 16. Isolation circuit 16 has a first P-channel transistor 74 having a source connected to the bit line BL0. A drain of transistor 74 is connected to a second segment of the first bit line BL0. A well of transistor 74 is connected to a conductor for receiving a bit line (BL) bias. An N-channel transistor 76 has a drain connected to the first segment of bit line 0. A gate of transistor 76 is connected to an isolation control signal labeled ISO. A source of transistor 76 is connected to the second segment of bit line 0. The ISO control signal is connected to an input of an inverter 72. An output of inverter 72 is connected to a gate of transistor 74 and to a gate of an N-channel transistor 78. A power terminal of inverter 72 is connected to the BL Bias voltage. Inverter 72 is referenced to the supply voltage $V_{SS}$. A drain of transistor 78 is connected to the second segment of bit line 0, and a source of transistor 78 is connected to a reference voltage terminal, labeled $V_{SS}$. The second segment of the bit line 0 is connected to the second array segment 14 which also contains floating gate memory storage transistors. The second array segment 14 receives two word line signals, labeled WL N and WL N+1, and a source line signal labeled SL M. It should be apparent that any number of memory cells may be implemented in each of the first segment and the second segment. For example, any number of memory cells may be connected to the bit line BL0 in the first array segment 12, and any number of memory cells may be connected to the bit line BL0 in the second array segment 14.

A P-channel transistor 73 has a source connected to the Bit Line Bias conductor, a gate for receiving the current mirror control signal, and a drain connected to a first bit line labeled BL1. The first bit line BL1 is connected to the bit line selector 22 of FIG. 1. A well of transistor 73 is also connected to the bit line bias conductor. The source of transistor 73 is connected to a plurality of floating gate memory devices of the first segment. A P-channel transistor 80 of isolation circuit 16 has a source connected to the first segment of BL1, a gate connected to the output of inverter 72, and a drain connected to a second segment of the first bit line, Seg2BL1. A plurality of floating gate memory cell transistors is connected to the bit line BL1. In the illustrated form, two floating gate memory cell transistors are shown connected to bit line BL1 in the second segment but any number of floating gate memory cell transistors may be implemented in the second array segment 14. An N-channel transistor 82 of isolation circuit 16 has a drain connected to the first segment of bit line BL1, a gate connected to the ISO control signal, and a source connected to the drain of transistor 80 and the second segment of bit line BL1. An N-channel transistor 84 has a drain connected to the second segment of bit line BL1, a gate connected to the output of inverter 72 for receiving an inverted form of the ISO control signal, and a source connected to the supply voltage $V_{SS}$.

In operation, isolation circuit 16 is implemented with transistors with complementary conductivity, it should be well understood that other forms can be used. For example, single conductivity transistor switches may be used. Transistors 74, 76 and transistors 80, 82 function as a transmission gate or switch. Transistors 78 and 84 serve to bias the bit lines in array segment 2 when transistors 74 and 76 are not conducting. However, in other technologies that function may not be essential. Additionally, the bias level that is referenced may not be $V_{SS}$ but rather another D.C. voltage level. Inverter 72 is designed such that its output swings between the maximum and minimum voltages to which the bit line is exposed in order to ensure that transistor 74 is completely nonconductive when intended to be. The ISO control signal may also need to be level shifted depending upon how inverter 72 is implemented.

Transistors 71 and 73 are a portion of the bit line program circuit 26. Transistors 71 and 73 are biased by a current mirror control signal provided by controller 40. These transistors 71 and 73 function as a constant current source when biased in an enabled state. A current reference within controller 40 is being mirrored into each of the bit lines. Additional elements of the bit line program circuit 26 (not shown) use the current provided by transistors 71 and 73.

The first array segment 12 illustrates, for purposes of brevity, only four memory cells. Each memory cell is represented by a transistor (not numbered). The source line SL0 is biased by source line (SL) driver 28. The bias provided by SL0 is a low voltage during read and erase and is at a higher voltage during programming for the purpose of appropriately biasing the adjoining memory cell.

Figure 3:
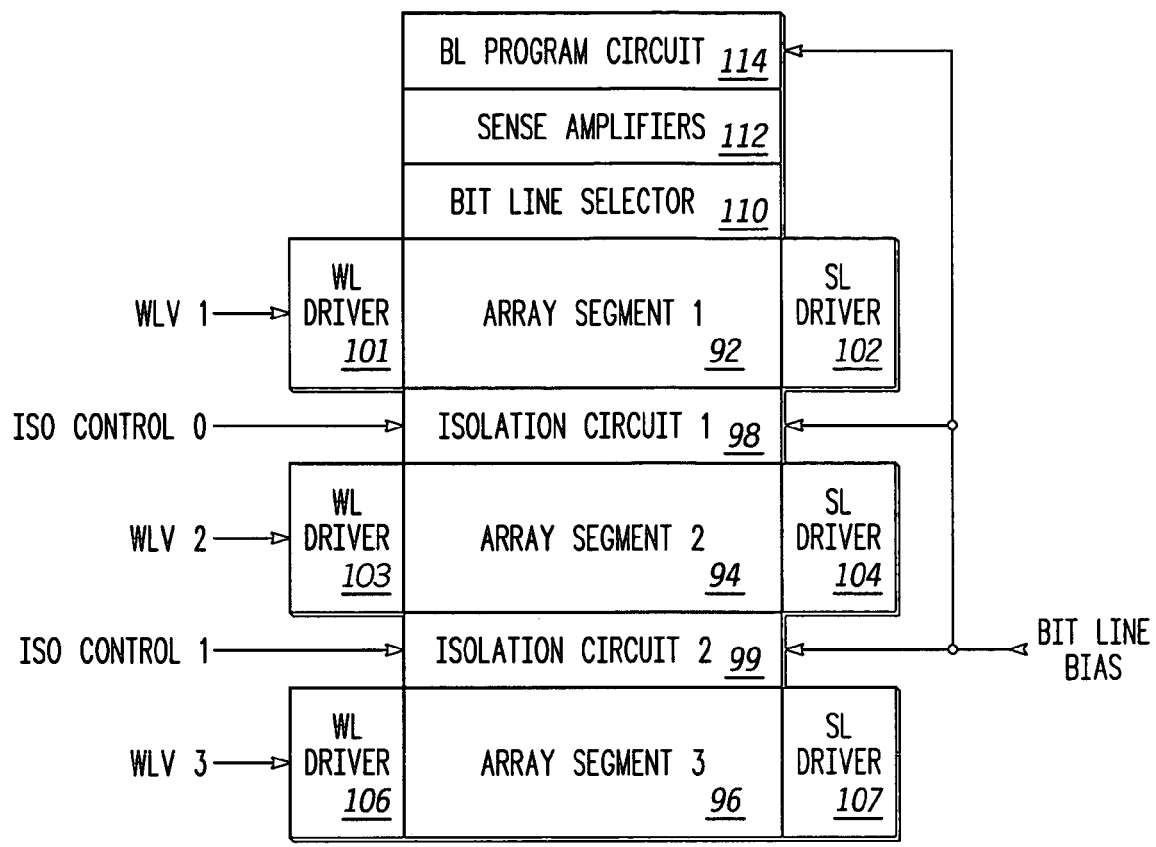
FIG. 3 is a block diagram of another form of a memory system in accordance with the present invention.

Illustrated in FIG. 3 is yet another form of a memory having bit line segment isolation. A memory 90 is illustrated having three array segments of predetermined size, each separated by an isolation circuit. Only one of the isolation circuits is operative at any point in time to divide memory 90 into two array segments. However, the relative sizes of the two array segments may be dynamically altered by a user of the memory 90. A first array segment 92 has a word line WL driver 101 and a source line SL driver 102 connected thereto. A second array segment 94 has a word line WL driver 103 and a source line SL driver 104 connected thereto. A third array segment 96 has a word line WL driver 106 and a source line SL driver 107 connected thereto. The word line WL driver 101 receives a word line voltage labeled WLV1. The word line WL driver 103 receives a word line voltage labeled WLV2. The word line WL driver 106 receives a word line voltage WLV3. A first isolation circuit 98 is connected between the first array segment 92 and the second array segment 94 and is controlled by an isolation control signal labeled "ISO Control 0". A second isolation circuit 99 is connected between the second array segment 94 and the third array segment 96 and is controlled by an isolation control signal labeled 'ISO Control 1'. A bit line selector circuit 110 is connected to each of the bit lines of the first array segment 92, the second array segment 94 and the third array segment 96. A plurality of sense amplifiers 112 is connected to the bit line selector circuit 110 for selectively sensing the state of each bit line relative to a reference signal. Sense amplifiers 112 may function to sense either current or a voltage. A bit line (BL) program circuit 114 is connected to the BL program circuit 114. The memory 90 may be substituted directly for memory system 10 of FIG. 1. Therefore, other connections to memory 90, such as the input for BL program circuit 114 for receiving input data, etc. are not shown for ease of explanation.

When the isolation circuits 98 and 99 function to divide the memory of memory 90 into two segments, the previous examples of memory 10 apply the same to the operation of memory 90. For example, a first segment will either contain array segment 1 only or both array segment 1 and array segment 2. A second segment conversely will either contain both array segment 2 and array segment 3 or only array segment 3. Memory 90 provides adaptability for a user to make a choice to both read and erase a same memory array with a segmented bit line based upon how much program information is used in a particular example. Since the memory structures provided herein permit continual ability to read program information while erasing another portion of the same memory, a user can dynamically alter the structure of the memory organization. The ISO control signals may also be dynamically changed during operation based upon the particular mode of operation, in addition to a one-time permanent basis.

In one form there is provided a memory having a bit line including a first segment and a second segment. A first memory cell is located on the first segment. A second memory cell is located on the second segment. An isolation circuit is provided wherein the first segment is selectively coupled to the second segment via the isolation circuit. In one example, the isolation circuit isolates the first segment from the second segment when the first memory cell is being read and the second memory cell is being erased. In one example the first segment is electrically coupled to the second segment via the isolation circuit when the second memory cell is being read. The memory further has a sense amplifier. The first memory cell is read by the sense amplifier and the second memory cell is read by the sense amplifier. The second memory cell is read by the sense amplifier via the first segment and the isolation circuit. In another example the first segment is electrically coupled to the second segment via the isolation circuit when the second memory cell is being read. In another form the isolation circuit includes a switch having a first circuit terminal coupled to the first segment and a second circuit terminal coupled to the second segment. In one form the switch includes a P-Channel transistor and in another form the switch is characterized as a CMOS transfer gate. In one form the first memory cell and the second memory cell are characterized as nonvolatile memory cells. In another form the first memory cell and the second memory cell are characterized as flash memory cells. In one form the first segment is electrically coupled to the second segment via the isolation circuit when the second memory cell is being programmed.

In another form the memory further includes a first plurality of memory cells located on the first segment, each of the first plurality is located on a separate word line. A second plurality of memory cells is located on the second segment, each of the second plurality of memory cells is located on a separate word line. In yet another form the bit line includes a third segment. In this form the memory further includes a third memory cell located on the third segment. A second isolation circuit is provided wherein the third segment is selectively coupled to the second segment via the second isolation circuit. In one example the second segment is electrically coupled to the third segment via the second isolation circuit when the third memory cell is being read. In another example the second isolation circuit isolates the third segment from the second segment when one of the second memory cell or the first memory cell is being read and the third memory cell is being erased.

In another form there is herein provided a method of operating a memory. The memory includes a bit line wherein the bit line includes a first segment and a second segment. The memory includes a first memory cell located on the first segment and a second memory cell located on the second segment. The second memory cell is erased with the first segment being isolated from the second segment. The first memory cell is read during the erasing. In another example the second memory cell is read during a time when the first segment is electrically coupled to the second segment. In another form the first memory cell and the second memory cell are non-volatile memory cells. In another form the first memory cell and the second memory cell are flash memory cells. In another form a switch is made nonconductive to isolate the first segment from the second segment, wherein the switch includes a first circuit terminal coupled to the first segment and a second circuit terminal coupled to the second segment. In one form the switch includes a P-Channel transistor and in another form the switch includes a CMOS transfer gate. In another form the second memory cell is programmed during a time when the first segment is electrically coupled to the second segment. In another example the first memory cell is read during a time when the first segment is electrically coupled to the second segment. In another example the second segment is biased to a D.C. voltage when the second segment is electrically isolated from the first segment. In one form the D.C. voltage is system ground.

In yet another form there is provided a memory having a bit line including a first segment and a second segment. A first plurality of memory cells is located on the first segment and a second plurality of memory cells is located on the second segment. The first segment is isolated from the second segment when any memory cell of the second plurality is being erased and a memory cell of the first plurality is being read. The first segment is electrically coupled to the second segment when any memory cell of the second plurality is being read. The first plurality of memory cells and the second plurality of memory cells are nonvolatile memory cells. In one form the first plurality of memory cells and the second plurality of memory cells are flash memory cells.

In another form there is provided a memory having a bit line including a first segment and a second segment. A first plurality of memory cells is located on the first segment. A second plurality of memory cells is located on the second segment. An isolation circuit is provided wherein the first segment is selectively coupled to the second segment via the isolation circuit. The isolation circuit isolates the first segment from the second segment when any memory cell of the second plurality is being erased and a memory cell of the first plurality is being read. The first segment is electrically coupled to the second segment via the isolation circuit when any memory cell of the second plurality is being read.

Various changes and modifications to the embodiments herein chosen for purposes of illustration will readily occur to those skilled in the art. For example, any data path width may be implemented with the disclosed memory structures. For example, it can accommodate eight, sixteen bit or larger data paths or other specific data paths for specific applications, such as for example error checking and correction (ECC). Although examples where one and two isolation circuits are illustrated, it should be apparent that any number of isolation circuits may be implemented to provide a desired plural number of array segments. The number of isolation circuits used is a tradeoff with the amount of additional impedance added to a bit line. To the extent that such modifications and variations do not depart from the spirit of the invention, they are intended to be included within the scope thereof which is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A memory comprising:
   a bit line including a first segment and a second segment;
   a first memory cell located on the first segment;
   a second memory cell located on the second segment; and
   an isolation circuit, the first segment selectively coupled to the second segment via the isolation circuit, the isolation circuit decoupling the first segment and the second segment when the second memory cell is being erased and the first memory cell is being read, and coupling the first segment and the second segment when the second memory cell is being read.

2. The memory of claim 1 further comprising:
a shared sense amplifier for use by both the first segment and the second segment, wherein the first memory cell is read by the sense amplifier and the second memory cell is read by the sense amplifier.

3. The memory of claim 2 wherein the second memory cell is read by the sense amplifier via the first segment and the isolation circuit.

4. The memory of claim 1 wherein the isolation circuit comprises a switch having a first circuit terminal coupled to the first segment and a second circuit terminal coupled to the second segment.

5. The memory of claim 4 wherein the switch comprises a CMOS transfer gate.

6. The memory of claim 1 wherein the first memory cell and the second memory cell are characterized as non volatile memory cells.

7. The memory of claim 1 wherein the first memory cell and the second memory cell comprise flash memory cells.

8. The memory of claim 1 wherein the first segment is electrically coupled to the second segment via the isolation circuit when the second memory cell is being programmed.

9. The memory of claim 1 further comprising:
a first plurality of memory cells located on the first segment, each of the first plurality of memory cells is located on a separate word line; and
a second plurality of memory cells located on the second segment, each of the second plurality of memory cells is located on a separate word line.

10. The memory of claim 1 wherein the bit line includes a third segment, the memory further comprising:
a third memory cell located on the third segment; and
a second isolation circuit, the third segment is selectively coupled to the second segment via the second isolation circuit.

11. The memory of claim 10 wherein the second segment is electrically coupled to the third segment via the second isolation circuit when the third memory cell is being read.

12. The memory of claim 10 wherein the second isolation circuit isolates the third segment from the second segment when one of the second memory cell or the first memory cell is being read and the third memory cell is being erased.

13. A method of operating a memory, the memory including a bit line, the bit line including a first segment and a second segment, the memory including a first memory cell located on the first segment and a second memory cell located on the second segment, the method comprising:
electrically isolating the first segment from the second segment;
erasing the second memory cell with the first segment being isolated from the second segment;
reading the first memory cell during the erasing; and
electrically coupling the first segment to the second segment for reading the second memory cell.

14. The method of claim 13 wherein the first memory cell and the second memory cell comprise non volatile memory cells.

15. The method of claim 14 wherein the first memory cell and the second memory cell comprise flash memory cells.

16. The method of claim 13 further comprising:
transitioning a switch between conductive and non-conductive states to isolate the first segment from the second segment depending upon a mode of operation of the memory, wherein the switch comprises a first circuit terminal coupled to the first segment and a second circuit terminal coupled to the second segment.

17. The method of claim 16 wherein the switch comprises a CMOS transfer gate.

18. The method of claim 16 further comprising:
programming the second memory cell during a time when the first segment is electrically coupled to the second segment.

19. The method of claim 16 further comprising:
reading the first memory cell during a time when the first segment is electrically coupled to the second segment.

20. The method of claim 16 further comprising:
biasing the second segment to a D.C. voltage when the second segment is electrically isolated from the first segment.

21. A memory comprising:
a bit line comprising a first segment and a second segment;
a first plurality of memory cells located on the first segment;
a second plurality of memory cells located on the second segment; and
means for isolating the first segment from the second segment when any memory cell of the second plurality of memory cells is being erased and a memory cell of the first plurality of memory cells is being read, and for electrically coupling the first segment to the second segment when any memory cell of the second plurality of memory cells is being read.

22. The memory of claim 21 wherein the first plurality of memory cells and the second plurality of memory cells comprise non volatile memory cells.

23. The memory of claim 21 wherein the first plurality of memory cells and the second plurality of memory cells comprise flash memory cells.

24. A memory comprising:
a bit line comprising a first segment and a second segment;
a first plurality of memory cells located on the first segment;
a second plurality of memory cells located on the second segment;
a sense amplifier coupled to the bit line, the sense amplifier functioning for both the first segment and the second segment of the bit line; and
an isolation circuit, the first segment being selectively coupled to the second segment via the isolation circuit, wherein the isolation circuit isolates the first segment from the second segment when any memory cell of the second plurality is being erased and a memory cell of the first plurality is being read, wherein the first segment is electrically coupled to the second segment via the isolation circuit when any memory cell of the second plurality is being read.

* * * * *